United States Patent [19]

Imai et al.

[11] Patent Number: 4,635,225

[45] Date of Patent: Jan. 6, 1987

[54] MAGNETIC BUBBLE CASSETTE

[75] Inventors: Satoru Imai; Toshiaki Sukeda, both of Suzaka, Japan

[73] Assignee: Fujitsu Limited, Kawasaki, Japan

[21] Appl. No.: 527,959

[22] Filed: Aug. 31, 1983

[30] Foreign Application Priority Data

Sep. 6, 1982 [JP] Japan ............................... 57-154877
Sep. 6, 1982 [JP] Japan ............................... 57-154878
Sep. 8, 1982 [JP] Japan ............................... 57-156387

[51] Int. Cl.$^4$ ............................................. G11C 19/08
[52] U.S. Cl. ......................................... 365/1; 361/345
[58] Field of Search ............................. 365/1, 2, 96.5; 360/132, 133, 134; 361/394, 399, 345; 339/40; 200/50 AA

[56] References Cited

U.S. PATENT DOCUMENTS

| | | | |
|---|---|---|---|
| 3,980,255 | 9/1976 | Serizawa | 242/199 |
| 4,017,901 | 4/1977 | Staar | 360/132 |
| 4,400,795 | 8/1983 | Irie et al. | 365/1 |
| 4,459,679 | 7/1984 | Sukeda et al. | 365/1 |

OTHER PUBLICATIONS

G. S. Kotrch, "Snap-In Substrate Holder for Coil Winder", vol. 20, No. 9, Feb. 1978; pp. 3411-3412; IBM Technical Disclosure Bulletin.

Primary Examiner—James W. Moffitt
Attorney, Agent, or Firm—Staas & Halsey

[57] ABSTRACT

A magnetic bubble cassette including a case containing a magnetic bubble device and a connector. The cassette has a cover that is pivotably mounted by means of a support pin on the end of said case so as to permit opening and closing of the case. When the case is opened, the cassette connector can be connected to another connector provided in a cassette holder in which the magnetic bubble cassette is inserted.

5 Claims, 17 Drawing Figures

MAGNETIC BUBBLE CASSETTE

BACKGROUND OF THE INVENTION

The present invention relates to a detachable magnetic bubble cassette in which a magnetic bubble device, for the storage or transfer of data, is housed in a cassette.

Attempts have been made recently to construct magnetic bubble devices in the form of cassettes. However, since a very small electric current flows through a magnetic bubble chip, maintaining the rated current becomes very difficult even if the slightest contamination exists on the connectors connecting the magnetic bubble cassette to external circuits such as peripheral circuits. Also, if the connector portions are touched directly by the human body, the data stored in the magnetic bubble chip may be destroyed by static electricity. Magnetic bubble devices constructed in the form of cassettes present a number of other difficulties, such as grounding of the magnetic bubble chip, preventing improper insertion of the magnetic bubble cassette, protection of the written data, and the like.

The magnetic bubble cassette is put into the cassette holder via a connector. Here, however, since a very small electric current flows through the magnetic bubble chip, it is essential that the connector reliably connects the cassette to the holder into which the cassette is placed. Furthermore, the cassette must be easy to load and unload in the holder.

SUMMARY OF THE INVENTION

A first object of the present invention is to construct a magnetic bubble device in the form of a cassette that effectively eliminates the above-mentioned problems.

A second object of the present invention is to effectively eliminate the above-mentioned problems that arise when a magnetic bubble cassette is loaded into a holder, such that the cassette and the holder can be reliably coupled via a connector and the cassette can be easily loaded and unloaded in the holder.

According to the present invention, there is first provided a magnetic bubble cassette which comprises a case, a magnetic bubble device contained in said case and comprising a magnetic bubble chip, a drive coil, a bias magnet, and a connector contained in the case for electrically connecting said magnetic bubble device to and external unit; the improvement wherein a cover that is pivotably mounted by means of a support pin on the end of said case so as to permit opening and closing of the case, and the connector is provided on the inside of the cover.

Thus, the connector of the magnetic bubble cassette is closed by the cover except when the magnetic bubble cassette is coupled to the connector on the side of the holder. Accordingly, the magnetic bubble cassette is not touched by the human body and is not contaminated by dust and dirt, and so it does not become defective with regard to electrical connection.

Secondly, according to the present invention, there is provided a magnetic bubble cassette that comprises an insulating case containing therein a magnetic bubble device comprising a magnetic bubble chip, a drive coil, and a bias magnet, the improvement wherein a cover, that is pivotably mounted by means of a support pin on the end of said case so as to permit opening and closing of the case, a connector is provided on the inside of the cover to electrically connect the magnetic bubble device to an external unit, a groove is formed on the outer surface of the magnetic bubble cassette to prevent it from being improperly inserted, and a grounding metal piece is provided in the groove to connect the magnetic bubble device to a ground circuit.

The groove prevents the magnetic bubble device from being improperly inserted. Further, the metal grounding piece is provided along the bottom of the groove, so that it may not be touched by the human body.

Thirdly, according to the present invention, there is provided a magnetic bubble apparatus that comprises a magnetic bubble cassette provided with an insulating case containing therein a magnetic bubble device comprising a magnetic bubble chip, a drive coil, and a bias magnet, said cassette having also a connector; and a cassette holder which holds the magnetic bubble cassette and which is connected thereto via the connector; wherein at least one of the sidewalls of the magnetic bubble cassette is provided with a recess with which a locking pawl engages, and the cassette holder is provided with said locking pawl which engages with the recess of the magnetic bubble cassette. The pivot axis of the locking pawl is located to one side of the magnetic bubble cassette from a straight line drawn perpendicularly to the plane where said recess meets said locking pawl, and the cassette holder is provided with an unlocking button at a position near the cassette-insertion port to unlock the locking pawl.

In this arrangement, if an attempt is made to pull out the cassette, engagement of the locking pawl tightens. This prevents the cassette from being inadvertently pulled out while the magnetic bubble device in the cassette is in operation. Also, the cassette is not removed by vibration, nor is the data stored in the cassette destroyed. The cassette holder is further provided with a button at a position near the cassette-insertion port to unlock the locking pawl. The locking pawl is unlocked by depressing the button while holding the cassette. Provision of the locking button thus does not complicate cassette manipulation.

DESCRIPTION OF THE PREFERRED EMBODIMENTS

Figure 1:
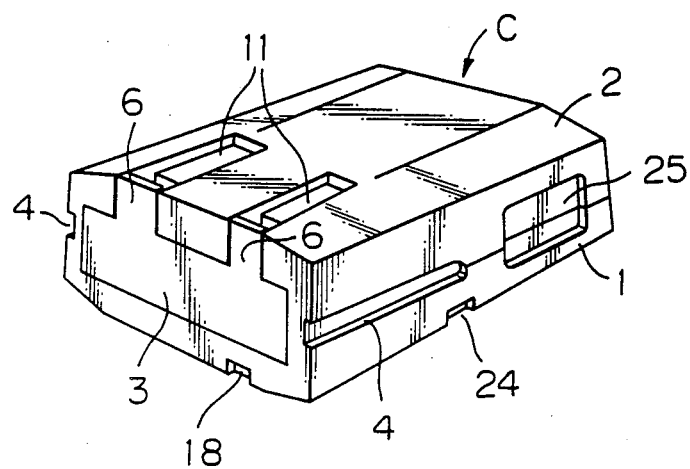
FIG. 1 is a perspective view of the magnetic bubble cassette with the cover closed.
Figure 2:
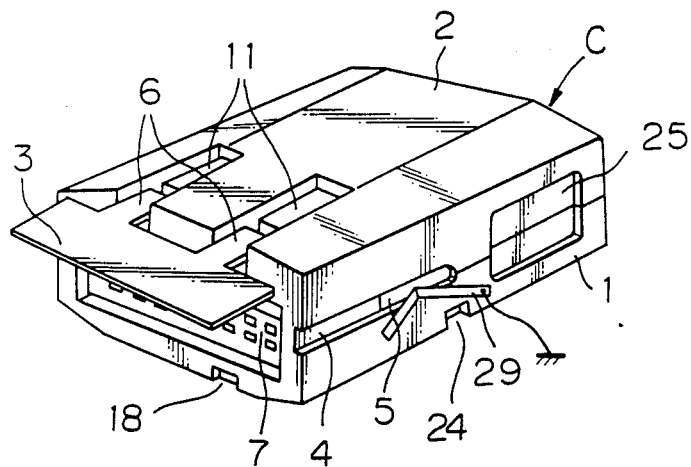
FIG. 2 is a perspective view of the cassette with the cover opened.
Figure 3:
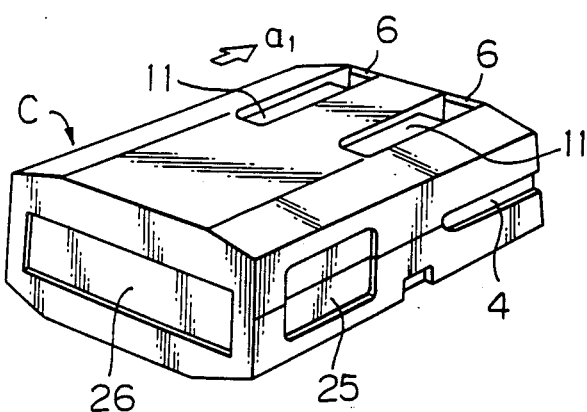
FIG. 3 is a perspective view of the back of the cassette.

In FIGS. 1 to 3, a magnetic bubble device is contained in a cassette C which consists of a lower cover 1 and an upper cover 2. The front surface of the magnetic bubble cassette C is covered by a cover 3 which is pivotable. As is apparent from FIG. 12, the upper cover 2 has a height $h_2$ which is greater than the height $h_1$ of the lower cover 1; i.e., the upper and lower covers are asymmetrical in the upper and lower directions. Grooves 4 are formed in the boundary between the upper cover 2 and the lower cover 1 to prevent the cassette from being improperly inserted.

Figure 12:
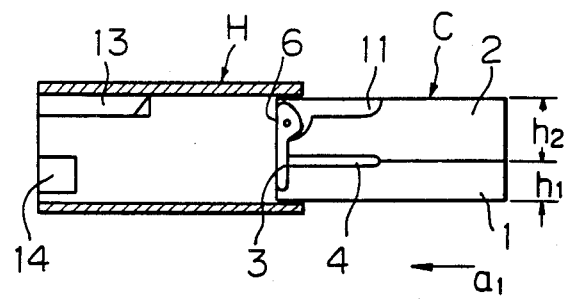
FIG. 12 is a diagram of the relationship between the cassette and the cassette holder before the cassette is completely inserted.
Figure 13:
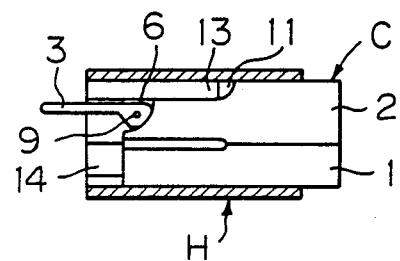
FIG. 13 is a diagram of the relationship between the cassette and the cassette holder after the cassette is completely inserted.

In front of the cover 3 of the magnetic bubble cassette, there is disposed opposite the cassette a connector 14 i.e., on the side of the cassette holder H as shown in FIGS. 12 and 13. To fit the magnetic bubble cassette to the opposing connector 14, the magnetic bubble cassette is pushed forward, i.e., toward the front of cover 3, from the back side thereof, as indicated by arrow $a_1$ (FIGS. 3, 12). To disconnect the connector, the magnetic bubble cassette C is pulled out in the reverse direction. The grooves 4 are formed parallel to the direction in which the magnetic bubble cassette C is loaded or unloaded. Metal pieces 5 (FIG. 2) for grounding are inlaid in the bottom of the grooves 4. The grooves 4 and grounding metal pieces 5 are advantageously provided on both side walls of the magnetic bubble cassette C.

Figure 4:
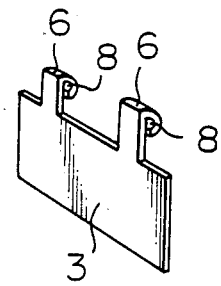
FIG. 4 is a perspective view of the cover used in the cassette.
Figure 5:
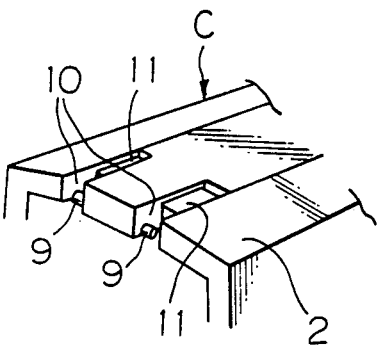
FIG. 5 is a perspective view of the portion of the cassette on which the cover is mounted.
Figure 6:
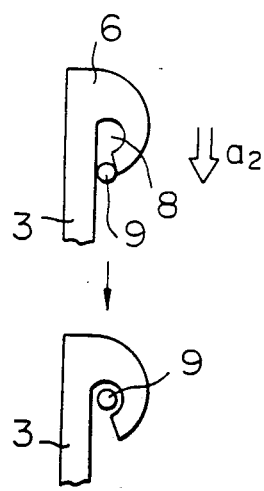
FIG. 6 is a diagram of the procedure for mounting the cover on the cassette.
Figure 7:
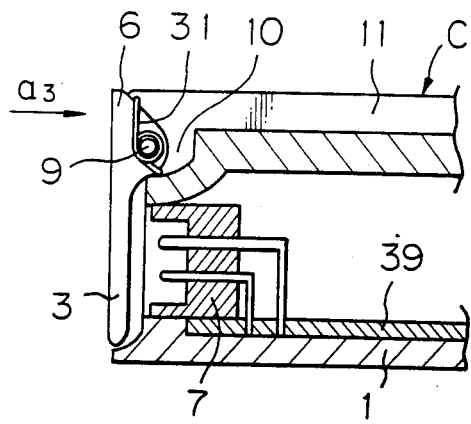
FIG. 7 is a cross-sectional view of the portion of the cassette on which the cover is mounted.

The cover 3 has, at its upper end, two pawls 6 which have downwardly opening slits 8, as shown in FIGS. 4, 6. The width of the opening of each slit 8 is smaller than that of the inner portion thereof. Referring to FIG. 5, a shaft 9 which is firmly inserted in the upper cover 2 and which is protruding into each slits 10, has a diameter that is smaller than that of the inner portion of the slit 8 and that is slightly greater than the width of the opening of the slits 8. As shown in FIG. 6, therefore, the opening of the slit 8 is placed on the shaft 9, and the cover is pushed in the direction of arrow $a_2$. This introduces the shafts 9 into the slits 8, such that the cover 3 does not escape easily. A torsion coil spring 31 is fitted to a shaft 9, as shown in FIG. 7, to draw the cover 3 toward the closing position.

In the top surface of the upper cover 2 are formed escape grooves 11 extending backward from the slits 10 for mounting the cover 3. The top ends of the pawls 6 of the cover 3 usually protrude above the bottom surface of the escape grooves 11 as shown in FIGS. 1, 3, and 7. When, however, the pawls 6 are pushed down in the backward direction, as indicated by arrow $a_3$ in FIG. 7, the cover 3 pivots to a horizontal position as shown in FIG. 2. This places the upper surface of the cover 3 at nearly the same level as the bottom surface of the grooves 11.

Figure 8:
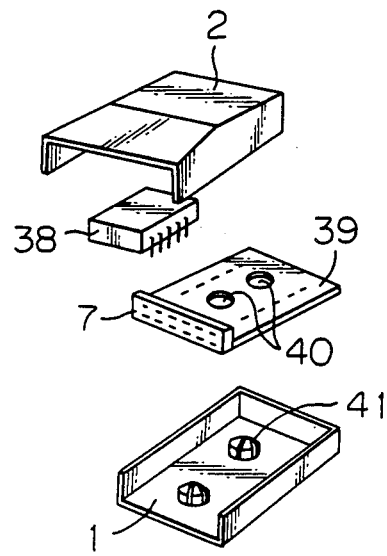
FIG. 8 is an exploded view of the magnetic bubble cassette.
Figure 9:
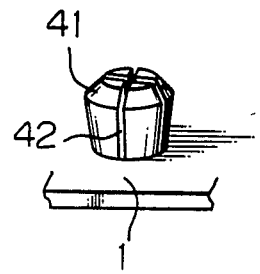
FIG. 9 is an enlarged view of a portion of FIG. 8.
Figure 10:
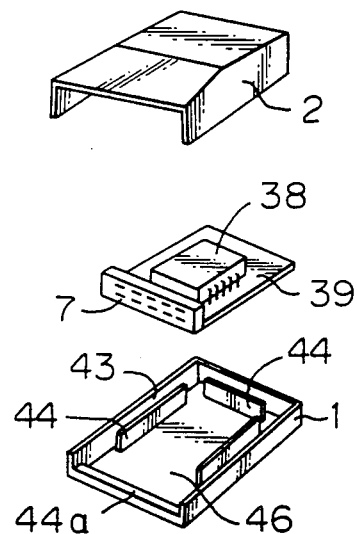
FIG. 10 is an exploded view of a magnetic bubble cassette according to another embodiment of the present invention.

The interior of the magnetic bubble cassette is shown in FIGS. 8 and 10. In FIG. 8, circular holes 40 are formed on a printed circuit substrate 39 equipped with the connector 7, on which substrate a magnetic bubble device 38 is mounted. Support pins 41 with slits formed integrally with the lower cover 1 are inserted in the circular holes 40. FIG. 9 is a perspective view which shows the support pin provided with slits. Slits 42 are formed in the support pin 41 that is formed integrally with the lower cover 1, allowing the outer diameter of the support pin 41 to contract upon insertion. Insertion of the support pins 41 into the holes 40 in this way firmly secures the printed substrate 39 to the lower cover 1 owing to the resilient force of support pins 41.

In FIG. 10, wall-like support plates 44 are formed integrally with the lower cover 1 on three sides, but not on the side where the connector 7 will be mounted, and separated from the side walls of the lower cover 1 by a gap 43. Since the connector 7 must be exposed, a protuberance 44a is formed on the lower cover 1 on the side of the connector 7, this protuberance having a thickness nearly equal to the thickness of the printed substrate 39. The inside dimensions of the support plates 44 and the protuberance 44a are slightly smaller than the outside dimensions of the printed substrate 39. This allows the printed substrate 39, which is forced into the space defined by the support plates 44 and protuberance 44a, to be firmly supported by the lower cover 1 owing to the resilient force of support plates 44. By providing a simply constructed means for integrally securing the printed board to the lower cover 1, as mentioned above, it is possible to firmly secure the printed substrate and the magnetic bubble device without the later development of rattling.

Figure 15:
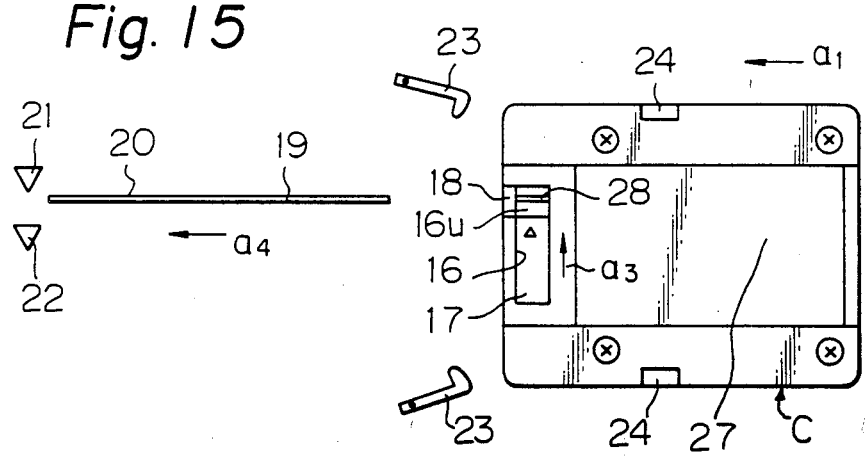
FIG. 15 is a view of the cassette from below.

As shown in FIG. 15, a groove 16 is formed in the bottom side of the magnetic bubble cassette C at the front end thereof at a right angle to the direction $a_1$ of insertion, and a slide piece 17 is fitted therein. The slide piece 17 is shorter than the groove 16. One end of the groove 16 is open to the front surface of the magnetic bubble cassette. Thus, when the slide piece 17 is retracted in the groove 16 to the position shown in FIG. 15, a recess 16u that communicates with an opening 18 is formed. On the other hand, the holder H is equipped with a shielding plate 20 secured by a pin 19, and a light-emitting element 21 and a light-receiving element 22 disposed on both sides of the shielding plate 20 in front of the opening 18.

Therefore, when the magnetic bubble cassette C is inserted in the holder H with the slide piece 17 retracted and the recess 16u formed on the side of the opening 18, the pin 19 enters into the opening 18 and the recess 16u; i.e., the pin 19 does not move. However, when the slide piece 17 slides in the direction of arrow $a_3$ to close the recess 16u on the side of the opening 18, the side surface of the slide piece 17 comes into contact with the pin 19. Namely, the pin 19 moves in the direction of arrow $a_4$, and the shielding plate 20 interrupts the light beam between the light-emitting element 21 and the light-receiving element 22; i.e., no light is received. This signal prevents the data of the magnetic bubble chip from being overwritten. Therefore, when the slide piece 17 is slid in the direction of arrow $a_3$, the data of the magnetic bubble chip is not overwritten inadvertently.

In FIG. 15, a recess 28 is formed in the bottom of the groove 16, and a protrusion (not shown) is formed on the bottom surface of the slide piece 17 at a position corresponding to the recess 28. When the slide piece 17 moves in the direction of arrow $a_3$, the protrusion on the slide piece 17 is inserted in the recess 28, locking the latter.

Recesses 25 (FIGS. 1 through 3) for gripping the cassette may be formed on both the right and left sidewalls of the magnetic bubble cassette C at positions different from the grooves 4 for preventing improper insertion and the grounding metal piece 5. Recesses 26 (FIG. 3) and 27 (FIG. 15) for sticking labels thereinto may also be formed on the back and bottom surfaces of the magnetic bubble cassette C, respectively.

Figure 11:
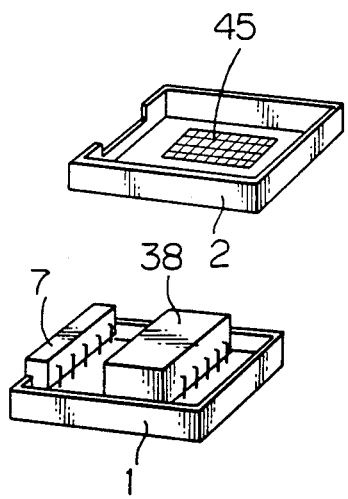
FIG. 11 is a perspective view of a display portion for indicating defective loops in the cassette.

The inner surface of the upper cover 2 may be utilized for indicating defective loops of the magnetic bubble chip as shown in FIG. 11, in which reference numeral 45 denotes a label which indicates defective loops of the magnetic bubble chip and which is attached to the inside surface of the upper cover 2. The label 45 may also be stuck onto the inner surface 46 of the lower cover 1 if there is no support pin provided, as shown in FIG. 10. Defective loops in the magnetic bubble chip are detected by the manufacturer before shipment, and are indicated on the label 45. The user may use the magnetic bubble chip without taking note of the defective loops. As long as the magnetic bubble chip is used in an ordinary manner, the user need not look at the label 45 to confirm the defective loops. However, if a memory loop of a defective loop is destroyed due to, for example, an abnormally intense magnetic field, the user should open the cover and confirm the defective loop to reuse it. The label indicating the defective loops may be attached to the front surface of the magnetic bubble device 38. However, if there exists an increased number of defective loops due to an increase in the bit capacity of the magnetic bubble chip, has been seen of late, the inside surface of the cover should be used to indicate defective loops.

Figure 14:
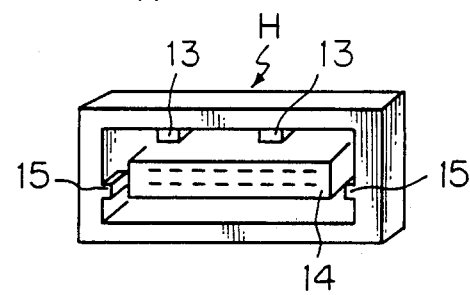
FIG. 14 is a schematic perspective view of the cassette holder.

In FIGS. 12 to 14, symbol H denotes a holder in which the magnetic bubble cassette C is inserted. The holder H has protuberances 13 formed on the inner surface of the ceiling thereof at positions corresponding to the escape grooves 11 of the cassette C. As shown in FIG. 12, the magnetic bubble cassette C is inserted in the direction of arrow $a_1$ toward the connector 14 of the opposing side, which is provided in the innermost portion of the holder H. This brings pawls 6 at the upper end of the cover 3 into contact with ends of protuberances 13 of the ceiling portion before the connectors inter-connected. Here, the pawls 6 are pushed down towards the back, and the cover 3 jumps up horizontally. As the magnetic bubble cassette C is further pushed under this condition, the protuberances 13 enter into the escape grooves 11 of the cassette C. The magnetic bubble cassette C further advances while the pawls 6 of the cover 3 are pushed down. Connector 7 (FIG. 2) in the magnetic bubble cassette C then couples to the connector 14 on the side of the holder H as shown in FIG. 13.

In FIG. 14, protuberances 15 are provided on the inside walls on both sides of the holder H. When the magnetic bubble cassette C is inserted, the protuberances 15 fit into the grooves 4 of the magnetic bubble cassette C. This prevents the magnetic bubble cassette C from being improperly inserted. That is, the grooves 4 are formed at asymmetrical positions in the upper and lower directions. Hence, if the magnetic bubble cassette C is inserted in the holder H upside down, the protuberances 15 are not allowed to enter into the grooves 4 formed in the magnetic bubble cassette C, and the magnetic bubble cassette C cannot be inserted. Here, the protuberances 15 and the grooves 4 in the magnetic bubble cassette also work as a guide for insertion of the magnetic bubble cassette C into the holder H, as well as to determine the positions relative to each other.

Thus, the connector 7 of the magnetic bubble cassette C is usually covered by the cover 3 which opens when the cassette is inserted in the holder H and just before the connector 7 is coupled to the connector 14. When the magnetic bubble cassette C is handled as a single unit, therefore, contact pieces of the connector 7 are not inadvertently touched by human body, and static electricity is not applied to the magnetic bubble chip. Also, the contact pieces are not contaminated. Furthermore, a grounding metal piece 5 (FIG. 2) is provided on the side wall of the magnetic bubble cassette, as mentioned hereinbefore. When the magnetic bubble cassette C is inserted in the holder 12, therefore, before the connector 7 is coupled to the connector 14, the metal piece 5 comes into contact with a grounding spring 29 which may be provided in the inner wall of the holder H and which may be grounded to the housing frame. The grounding metal 5 is connected to the grounding circuit of the magnetic bubble device, which is thus reliably grounded to the grounding circuit of the holder.

According to the present invention, even if the case of the magnetic bubble cassette is made of an insulating material and is charge electrostatically due to any reason, such static electricity can easily be discharged before the electrical connection by means of the connectors 7 and 14 is established.

The magnetic bubble memory cassette C which is inserted in the holder H so that the connectors are coupled together, is then locked by the locking mechanism described below so that the connectors do not separate from each other. That is, as shown in FIG. 15, recesses 24, 24 are formed in both sidewalls of the cassette so that locking pawls 23 may be inserted therein, and the holder has the locking pawls 23 that protrude from the inner walls toward the cassette housing portion. Such a locking pawl or pawls may be provided on both sides, or may be provided on at least one side as shown in FIG. 16.

Figure 17:
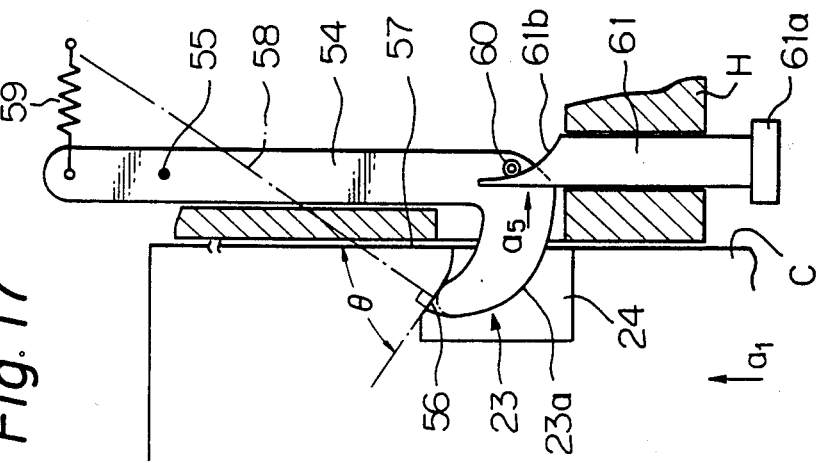
FIG. 17 is a transverse sectional view of the mechanism for locking the cassette.

FIG. 17 is an enlarged sectional view showing the relationship between the locking pawl 23 and the recess 24 in which the locking pawl is inserted. The locking pawl 23 consists of a sickle-shaped hook, and a root portion of a trunk portion 54 thereof is supported by the holder H via a support shaft 55. A surface 56 in the recess 24 with which the locking pawl 23 engages is tilted at an angle $\theta$ smaller than 90° relative to the side surface 57 of the cassette. The support shaft 55 is located at a position in the vicinity of the cassette C with respect to a straight line 58 perpendicularly drawn from the tilted engaging surface 56. The locking pawl 23 is energized by a spring 59 such as to drive into the recess 24.

Figure 16:
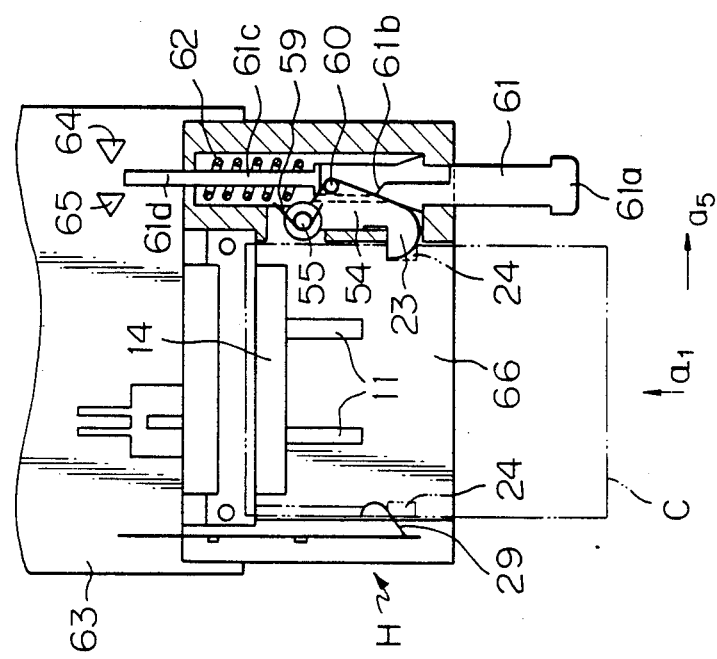
FIG. 16 is a transverse sectional view of the cassette holder.

The locking pawl 23 in each of FIGS. 16 and 17 has a roller 60 supported by a shaft at a position that does not protrude into the cassette housing portion. The holder H is equipped with an unlocking button 61 that pushes the roller 60 away from the cassette C. The unlocking button 61 consists of a working button portion 61a and a tilted surface 61b in each of FIGS. 16 and 17, and a return spring-mounting portion 61c and a shielding portion 61d in FIG. 16, all in alignment. In FIG. 16, a return spring 62 is fitted to the return spring-mounting portion 61c to push the unlocking button 61 toward the side of the cassette-insertion opening.

If cassette C is now inserted in the holder H in the direction of arrow $a_1$ in FIGS. 16 and 17, the end of the cassette comes into contact with the tilted surface 23a of locking pawl 23. That is, the locking pawl 23 is made to move in the direction of arrow $a_5$. The recess 24 of the cassette then comes to a position corresponding to that of the locking pawl 23. At this position, the locking pawl 23 is pushed by the spring 59 and enters into the recess 24.

As mentioned earlier, the support shaft 55 is located to one side of the cassette C from the straight line 58 drawn perpendicular to the tilted engaging surface 56 in FIg. 17. Thus, if the cassette C is pulled out in the direction opposite to the direction of arrow $a_1$ while the locking pawl 23 is inserted in the recess 24 of the cassette, a force acts upon the locking pawl 23 causing it to engage deeply with the engaging surface 56 rather than to disengage. Therefore, cassette C cannot be pulled out of the holder without first pressing the unlocking button 61.

To remove the cassette C from the holder H, the unlocking button 61 is depressed, and the roller 60 is pushed by the tilted surface 61b toward the direction of arrow $a_5$, as shown in FIGS. 16 and 17. The locking pawl 23 then turns in the direction of arrow $a_5$ about the support shaft 55, and is disengaged from the recess 24. If the cassette C is in this way pulled out in a direction opposite to the direction of arrow $a_1$, connectors 7 and 14 first separate away from each other, allowing the cassette C to be removed from the cassette housing portion.

Furthermore, as mentioned above, the support shaft 55 is located to one side of the cassette C from the straight line 58 drawn perpendicular from the tilted engaging surface 56. When the locking pawl 23 is to be turned by the unlocking button 61 in the direction of arrow $a_5$, therefore, the locking pawl 23 turns without contacting the engaging surface 56. Accordingly, the locking pawl 23 can be easily and reliably retracted by depressing the button with a small force.

The surface of locking pawl 23, which contacts the engaging surface 56, has a flat shape. This surface, however, may be arcuate, as indicated by the dotted line in FIG. 17.

With respect to the embodiment of FIG. 16, the unlocking button 61 is disposed at a position close to the cassette insertion port 66 of the holder H. When the cassette C is to be removed manually, therefore, the unlocking button 61 is depressed. The unlocking button 61 can be depressed by a touch of the finger, followed by removal of the cassette, all in a single operation. If the unlocking button 61 was located on the left side of the cassette C, the unlocking button 61 might be depressed by the tip of the thumb while holding the cassette.

On the back surface of the holder H is mounted a printed circuit substrate 63 on which are mounted peripheral circuits for the magnetic bubble device. A light-emitting element 64 and a light-receiving element 65 are also located on the printed substrate 63 in such a manner that the shielding portion 61d operated by the unlocking button 61 can be disposed therebetween. As the unlocking button 61 is depressed, the light beam between the light-emitting element 64 and the light-receiving element 65 is interrupted by the shielding portion 61d. This signal is input to the peripheral circuit on the printed substrate 63 to serve notice that the cassette C is to be removed, thereby processing being carried out smoothly even after the cassette has been removed.

In the embodiment of FIG. 16, the trunk portion 54 of the locking pawl, the unlocking button 61, and the shielding portion 61d are aligned in parallel in one side of the cassette within the holder, and therefore do not result in the holder being bulky. Here, the unlocking button 61 may be a button that is locked per se when depressed.

We claim:

1. A magnetic bubble cassette comprising
a case for being inserted into an external unit, wherein said case is made of an electrically insulating material and is grooved on its outside surface to define a proper insertion into said external unit,
a magnetic bubble device contained in said case, said magnetic bubble device including a magnetic bubble chip, a drive coil, and a bias magnet and said magnetic bubble device having a respective part to be grounded when inserted in said external unit,
a respective connector contained in said case for electrically connecting said magnetic bubble device to said external unit when inserted therein,
a cover pivotably mounted by means of a support pin on the end of said case so as to be opened and closed when said case is inserted into and removed from said external unit, respectively,
said connector of said case being provided on the inside of said cover of said case, and
a grounding metal piece provided in at least one of said grooves of said case, each said metal piece being connected to said part of said magnetic bubble device to be grounded.

2. A cassette-type magnetic bubble apparatus comprising:
a magnetic bubble cassette including a case containing
a magnetic bubble device including a magnetic bubble chip, a drive coil, and a bias magnet, and
a first connector for electrically connecting to said magnetic bubble device;
a cassette holder having a second connector for connection to the first connector of said cassette, and which holds said cassette;
said cassette including a support pin on one end of said case and a cover that is pivotably mounted by means of said support pin on the end of said case such as to permit opening and closing of the case, said cover having at least one pawl for opening said cover, and said second connector being provided on the inside of said cover of said cassette; and
said cassette holder having at least one protuberance which, when the cassette is being inserted therein, engages with said at least one pawl provided on said cover to fully open said cover before said first and second connectors first come into contact with each other when said cassette is being inserted into said cassette holder, and prior to complete insertion.

3. A cassette-type magnetic bubble apparatus as set forth in claim 2, wherein said cassette case has grooves formed in the outer surface thereof to prevent improper insertion into said cassette holder and said holder has protuberances that engage with said grooves when the cassette is inserted.

4. A cassette-type magnetic bubble apparatus as set forth in claim 3, wherein said cassette case is made of an electrically insulating material, a grounding metal piece is provided in at least one of said grooves and is connected to a grounding circuit of the magnetic bubble device, and said holder has at least one grounding metal spring which, when the cassette is being inserted in said cassette holder, comes into contact with said at least one grounding metal piece before said connectors are connected to each other.

5. A cassette-type magnetic bubble apparatus comprising:
   a cassette including a case containing therein
      a magnetic bubble device including a magnetic bubble chip, a drive coil and a bias magnet, and
      a connector which electrically connects said magnetic bubble device to an external unit; and
   a cassette holder which receives said cassette through a cassette-insertion port and holds said cassette, said holder including a locking pawl and a connector for connection to the connector of said cassette when said cassette is inserted into said cassette holder;
   at least one of the side walls of said cassette being provided with a recess into which said locking pawl is inserted to contact a surface of said cassette in said recess;
   said locking pawl being pivoted at a pivot point for the insertion into said recess of said cassette, the pivot point of said locking pawl being located between a side of the cassette adjacent to said pivot point and the extension of a straight line drawn perpendicularly to the plane of said surface of said cassette in said recess where said locking pawl contacts said surface; and
   said cassette holder being provided with an unlocking button at a position near the cassette-insertion port to unlock the locking pawl.

* * * * *